United States Patent
Ogiso et al.

[11] Patent Number: 5,959,391
[45] Date of Patent: *Sep. 28, 1999

[54] PIEZOELECTRIC TRANSFORMER

[75] Inventors: Koji Ogiso, Moriyami; Akira Ando, Omihachiman, both of Japan

[73] Assignee: Murata Manufacturing Co., Ltd., Japan

[*] Notice: This patent is subject to a terminal disclaimer.

[21] Appl. No.: 08/801,905

[22] Filed: Feb. 14, 1997

[30] Foreign Application Priority Data

Feb. 14, 1996 [JP] Japan ................................ 8-026919

[51] Int. Cl.⁶ .................................................. H01L 41/08
[52] U.S. Cl. ........................................... 310/359; 310/366
[58] Field of Search .................................. 310/358, 359, 310/366, 317

[56] References Cited

U.S. PATENT DOCUMENTS

| | | | |
|---|---|---|---|
| 3,549,913 | 12/1970 | Moriki et al. | 310/359 |
| 3,736,446 | 5/1973 | Berlincourt et al. | 310/359 |
| 5,440,195 | 8/1995 | Ohnishi et al. | 310/359 |
| 5,576,590 | 11/1996 | Ohnishi et al. | 310/359 |

*Primary Examiner*—Mark O. Budd
*Attorney, Agent, or Firm*—Joseph R. Keating, Esq.; Graham & James LLP

[57] ABSTRACT

A piezoelectric transformer includes a plate-shaped piezoelectric member having a driving section located at a first portion of the piezoelectric member including a first end and a power-generating section located at a second portion of the piezoelectric member including a second end. The driving section is made by repeatedly and alternately laminating a driving electrode and a portion of the piezoelectric member which is polarized in the thickness direction. The power-generating section includes a power-generating electrode and a portion of the piezoelectric member which is polarized in the longitudinal direction. In the piezoelectric transformer, at least one of the driving section and the power-generating section has an area which is near a boundary between the driving section and the power-generating section which has a lower degree of polarization than the degree of polarization in areas spaced away from the boundary between the driving section and the power-generating section.

13 Claims, 3 Drawing Sheets

PIEZOELECTRIC TRANSFORMER

BACKGROUND OF THE INVENTION

1. Field of the Invention

The present invention relates to piezoelectric transformers which use piezoelectric members.

2. Description of the Related Art

A piezoelectric transformer includes an elongated plate-type piezoelectric member and first and second electrodes disposed opposite to each other in a thickness direction of the piezoelectric member. The first and second electrodes are located on a first portion of the piezoelectric member at a first end in a longitudinal direction of the piezoelectric member, and the piezoelectric member is polarized in the thickness direction at the first portion of the piezoelectric member at which the first and second electrodes are disposed. A third electrode is located on the end surface of a second portion of the piezoelectric member which includes a second end disposed opposite to the first end in the longitudinal direction, and the piezoelectric member is polarized in the longitudinal direction at the second position at which the third electrode is located. The first portion having the pair of electrodes disposed opposite to each other in the thickness direction functions as a driving section or an input section. The second portion functions as a power generating section or an output section.

When an input voltage having a natural frequency determined by the dimension of the piezoelectric member in the longitudinal direction is applied between the electrodes of the driving section, which are disposed at the first portion of the piezoelectric member, the piezoelectric member generates strong mechanical vibration in the longitudinal direction due to an electrical deformation effect. Then, the piezoelectric member generates charges at the second portion functioning as the power generating section due to the piezoelectric effect. These charges flow as an alternating high voltage between one of the pair of electrodes in the driving section and the electrode of the power generating section. In this way, the piezoelectric transformer causes a voltage rise through a conversion from electrical energy to mechanical energy and then a conversion from the mechanical energy to electrical energy.

In such a piezoelectric transformer, a piezoelectric ceramic material such as lead zirconate titanate is usually used to form the piezoelectric member.

As a piezoelectric transformer having a relatively large voltage-rise ratio, a laminated piezoelectric transformer has been proposed. The laminated piezoelectric transformer includes a piezoelectric member made up of a laminated-layer member including a plurality of piezoelectric ceramic layers. A plurality of driving electrodes serving as input electrodes are formed such that an electrode opposes an adjacent electrode or adjacent electrodes through the piezoelectric ceramic. On external surfaces of the laminated-layer member, driving terminal electrodes and a power-generating terminal electrode are located. A plurality of driving electrodes are electrically and alternately connected to the opposite terminal electrodes. The power-generating terminal electrode serves as an output electrode.

Since the driving section and the power-generating section are polarized by using electrodes extending in the thickness and longitudinal directions for input and output in the above-described piezoelectric transformer, the degree of polarization is uniform both in the driving section and the power-generating section.

As a result of this arrangement, internal stress is generated at the boundary between the driving section and the power-generating section, in which the directions of polarization differ. The internal stress may cause the piezoelectric member to be destroyed when polarized or one or more small cracks in the piezoelectric member may occur upon polarization thereby reducing the mechanical strength of the piezoelectric member.

SUMMARY OF THE INVENTION

The preferred embodiments of the present invention provide a piezoelectric transformer having superior mechanical strength, in which the generation of small cracks and the destruction of the piezoelectric member caused by generation of internal stress resulting from polarization are prevented.

According to a preferred embodiment of the present invention, a piezoelectric transformer includes a piezoelectric member including a first portion having a first polarization level and a second portion having a second polarization level different from the first polarization level. More specifically, the piezoelectric member includes a driving section and a power-generating section which are integrally formed, wherein at least one of the driving section and the power-generating section has an area or portion which is located near a boundary between the driving section and the power-generating section and which has a lower degree of polarization than a degree of polarization in areas or portions located spaced from the boundary between the driving section and the power-generating section.

According to another preferred embodiment of the present invention, a piezoelectric transformer includes a piezoelectric member which has a driving section including a driving electrode and a portion of the piezoelectric member which is polarized in a thickness direction thereof and which includes one end of the piezoelectric member and a power-generating section including a power-generating electrode and a portion of the piezoelectric member which is polarized in a longitudinal direction thereof at a second portion of the piezoelectric member including the other end of the piezoelectric member, wherein at least one of the driving section and the power generating section has an area which is near the boundary between the driving section and the power-generating section and which has a lower degree of polarization than the degree of polarization in areas spaced away from the boundary between the driving section and the power-generating section.

The piezoelectric member may be made of ceramic or other suitable piezoelectric material.

According to the preferred embodiments of the present invention, since the piezoelectric member has two different degrees of polarization and at least one of the driving section and the power-generating section has an area which is located near the boundary between the driving and power-generating sections and which has a lower degree of polarization than a degree of polarization in areas located spaced from the boundary between the driving and power-generating sections, the generation of small cracks and the destruction of the piezoelectric member due to internal stress caused by polarization are prevented. Therefore, a piezoelectric transformer having superior mechanical strength is obtained.

These and other elements, features, and advantages of the preferred embodiments of the present invention will be apparent from the following detailed description of the preferred embodiments of the present invention, as illustrated in the accompanying drawings.

DESCRIPTION OF PREFERRED EMBODIMENTS

Figure 1:
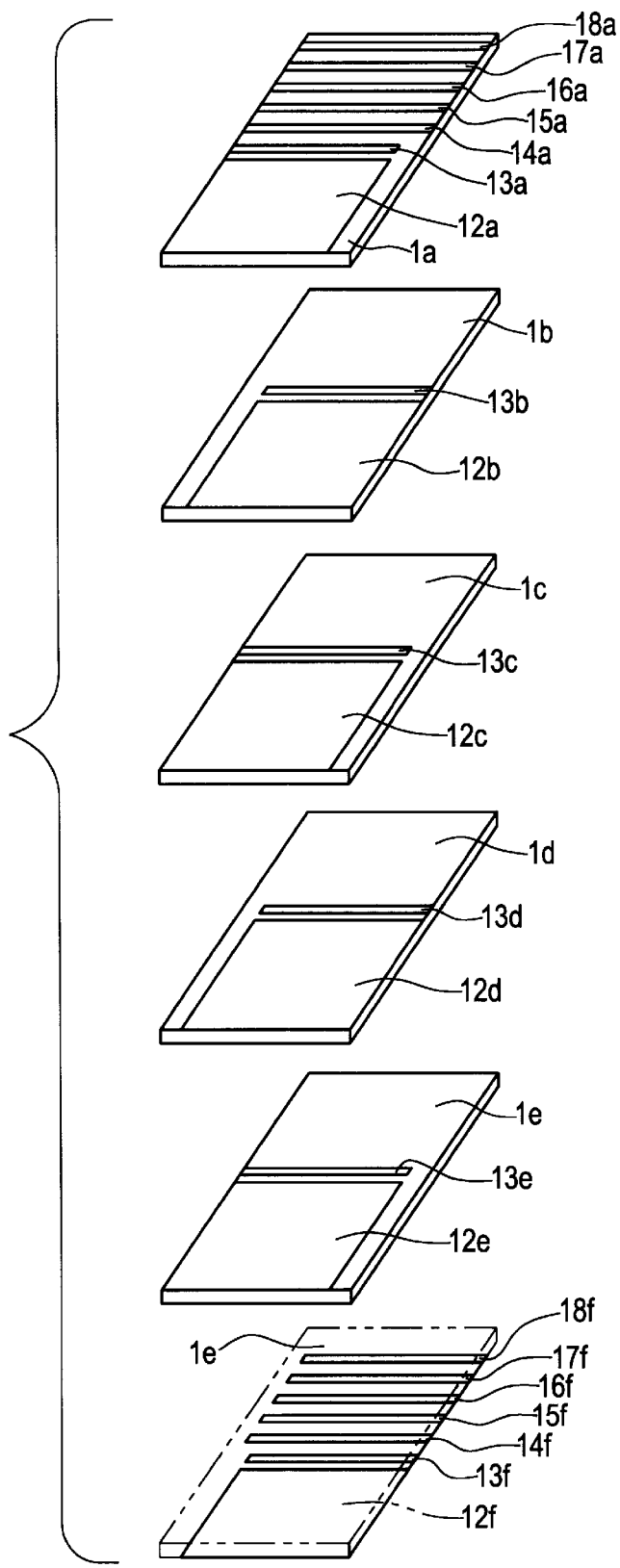
FIG. 1 is an exploded, perspective view of an unsintered laminated green sheet unit used in a piezoelectric transformer according to a preferred embodiment of the present invention.

A piezoelectric transformer according to a preferred embodiment of the present invention will be described below by referring to the drawings.

FIG. 1 is an exploded, perspective view of an unsintered laminated green sheet-unit used in a piezoelectric transformer in which a piezoelectric member is preferably made of a ceramic material, according to a preferred embodiment of the present invention. In FIG. 1, there is shown green sheets 1a, 1b, 1c, 1d, and 1e made of a piezoelectric material, driving electrodes 12a, 12b, 12c, 12d, 12e, and 12f, and polarization electrodes 13a, 13b, 13c, 13d, 13e, 13f, 14a, 14f, 15a, 15f, 16a, 16f, 17a, and 17f. In the bottom section of the exploded view shown in FIG. 1, the green sheet 1e is preferably transparent in order to indicate the arrangement of the driving electrodes disposed on the lower surface of the green sheet 1e.

Figure 2:
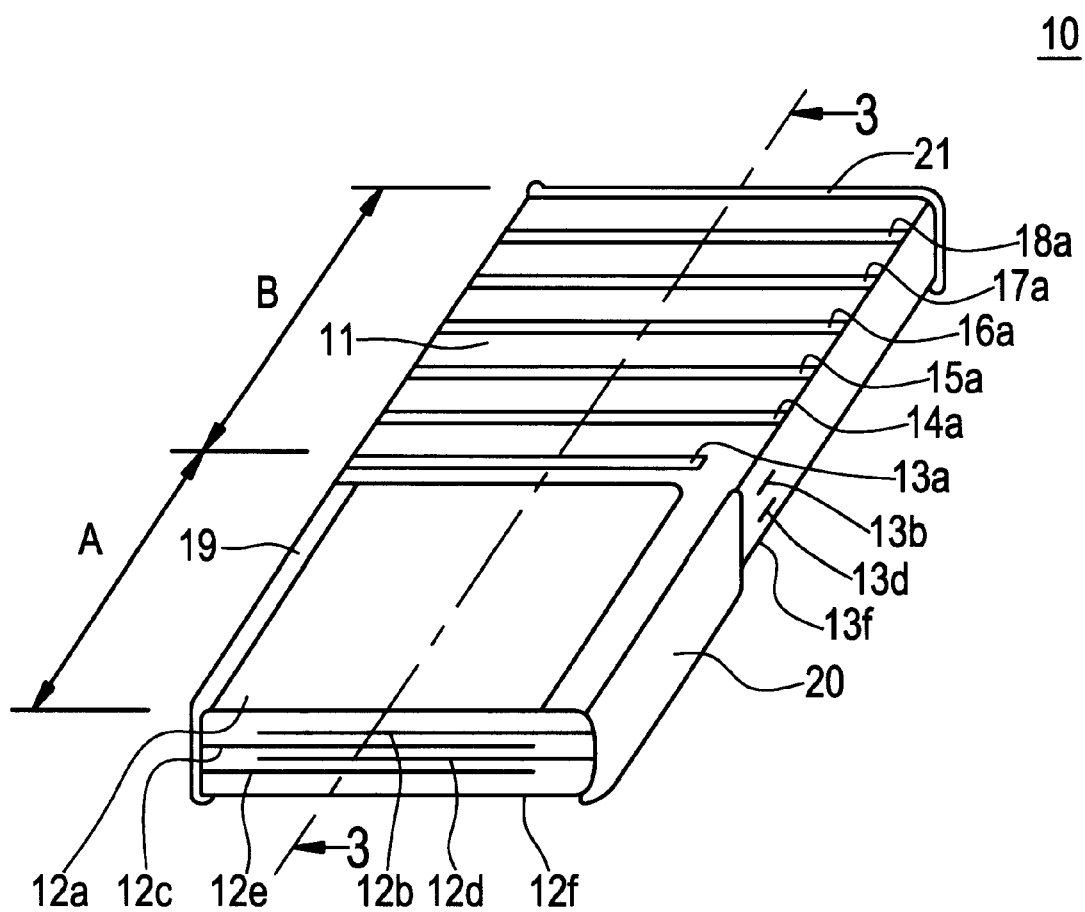
FIG. 2 is a perspective view of a piezoelectric transformer having the laminated green sheet unit shown in FIG. 1.

FIG. 2 is a perspective view of a piezoelectric transformer 10 having the laminated green sheet unit shown in FIG. 1. In FIG. 2, there is shown a piezoelectric member 11, a driving section A, and a power-generating section B. There is also shown terminal electrodes 19 and 20 functioning as driving electrodes and a terminal electrode 21 functioning as a power generation electrode. Since the other portions are the same as those shown in FIG. 1, the same reference numerals used in FIG. 1 are used in FIG. 2 and the description thereof is omitted.

Figure 3:
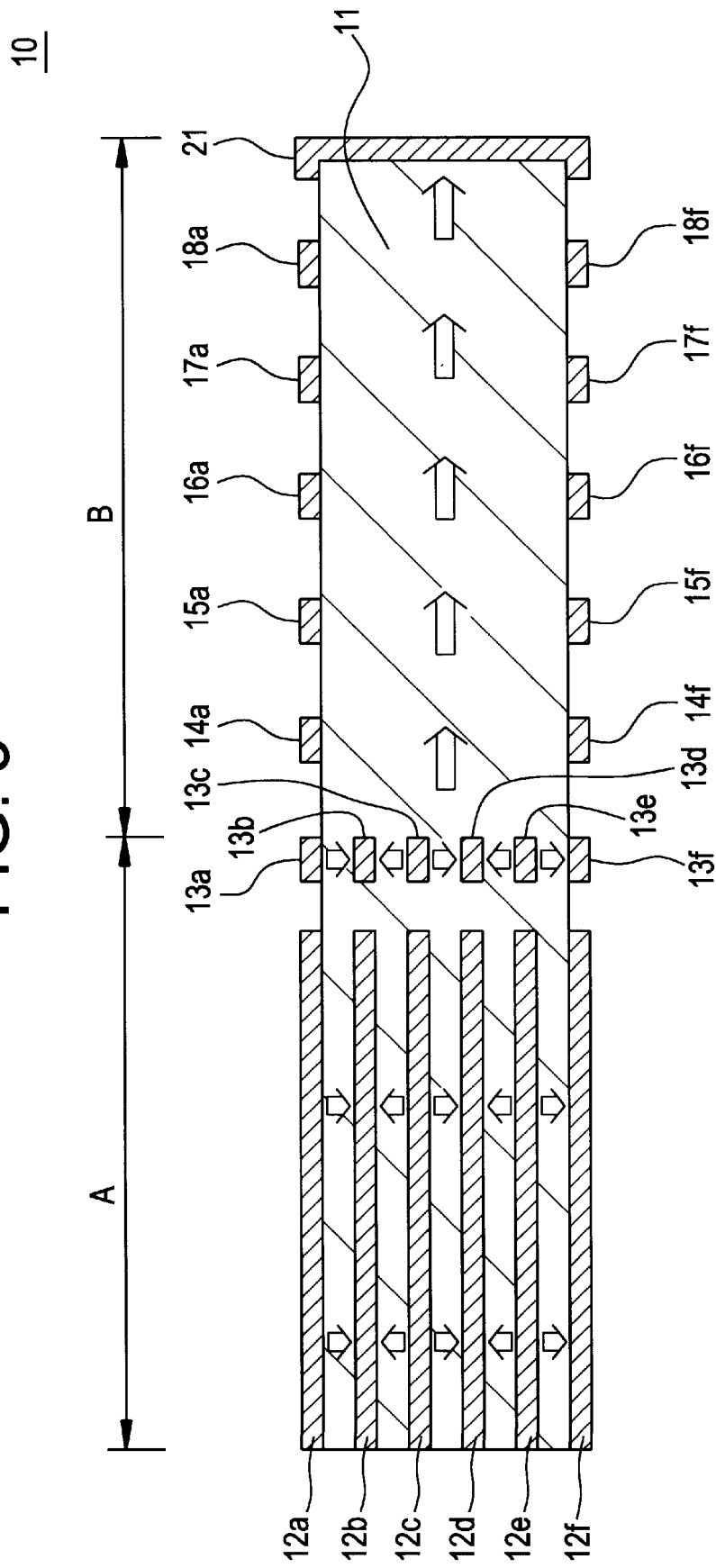
FIG. 3 is a cross section taken along plane X-Y of the piezoelectric transformer shown in FIG. 2.

FIG. 3 is a cross section taken along plane X-Y of the piezoelectric transformer 10 shown in FIG. 2. Since each portion is the same as that shown in FIGS. 1 and 2, the same reference numerals used in FIGS. 1 and 2 are used in FIG. 3 and the description thereof is omitted.

A preferred manufacturing method of the piezoelectric transformer 10 shown in FIGS. 2 and 3 will be described below by referring to FIG. 1.

The green sheets 1a, 1b, 1c, 1d, and 1e made up of a piezoelectric material are first prepared. The green sheets 1a–1f are preferably made by mixing Pb(Zr, Ti)O$_3$ ceramic powder with a binder and a solvent to make a paste and sheets are prepared preferably using a doctor blade method.

On the front surface of the green sheet 1a, a substantially rectangular driving electrode 12a, approximately-I-shaped polarization electrodes 13a, 14a, 15a, 16a, 17a, and 18a are formed preferably by a screen printing method with the use of conductive paste having Ag/Pd as an electrically conductive component. The gap between the electrodes 12a and 13a is preferably about 1 mm and the gap between other adjacent electrodes is preferably about 2 mm. The electrodes preferably have the shapes shown in FIG. 1.

In the same way, the driving electrode 12b and the polarization electrode 13b are formed on the front surface of the green sheet 1b. The driving electrode 12c and the polarization electrode 13c are formed on the front surface of the green sheet 1c. The driving electrode 12d and the polarization electrode 13d are formed on the front surface of the green sheet 1d. The driving electrode 12e and the polarization electrode 13e are formed on the front surface of the green sheet 1e.

On the rear surface of the green sheet 1e, the driving electrode 12f and the polarization electrodes 13f, 14f, 15f, 16f, 17f, and 18f are formed. The gap between the electrodes 12f and 13f is preferably about 1 mm and the gap between other adjacent electrodes is preferably about 2 mm. The electrodes preferably have the shapes shown in FIG. 1.

As shown in FIG. 1, the green sheets 1e, 1d, 1c, 1b, and 1a are stacked and pressed to form a laminated green sheet unit.

The laminated green sheet unit is then sintered preferably at approximately 1,100° C. to form the piezoelectric member 11 having electrodes on the inside and outside. With the use of conductive paste preferably having Ag as the main component, the terminal electrode 19 electrically connected to the driving electrodes 12a, 12c, and 12e and the terminal electrode 20 electrically connected to the driving electrodes 12b, 12d, and 12f are formed on surfaces of the piezoelectric member 11. In addition, the terminal electrode 21 for power generation is formed at the end surface of the power-generating section.

Next, the piezoelectric member obtained as described above is polarized in silicone oil. Between one electrode made by electrically short-circuiting the electrodes 13a, 13c, and 13e, and the other electrode made by electrically short-circuiting the electrodes 13b, 13d, and 13f, an electric field of about 0.5 to about 1.5 kV/mm is preferably applied at approximately 100° C. The piezoelectric member 11 is polarized to such an extent that the degree of polarization in the thickness direction in the piezoelectric member does not reach saturation.

The piezoelectric member 11 is then polarized until the degree of polarization in the thickness direction in the piezoelectric member reaches saturation by applying an electric field of about 2 to about 5 kV/mm to the terminal electrodes 19 and 20 preferably at approximately 100° C.

Between one electrode made by electrically short-circuiting the electrodes 13a, 13b, 13c, 13d, 13e, and 13f, and the other electrode made by electrically short-circuiting the electrodes 14a and 14f, an electric field is applied. The piezoelectric member is polarized to such an extent that the degree of polarization in the longitudinal direction in the piezoelectric member does not reach saturation.

An electric field is applied between one electrode made by electrically short-circuiting the electrodes 14a and 14f, and the other electrode made by electrically short-circuiting the electrodes 15a and 15f. The piezoelectric member 11 is polarized in the longitudinal direction until the degree of polarization in the piezoelectric member reaches saturation. The direction of polarization is the same as that for the polarization between one electrode made by electrically short-circuiting the electrodes 13a, 13b, 13c, 13d, 13e, and 13f, and the other electrode made by electrically short-circuiting the electrodes 14a and 14f. In the same way, the piezoelectric member is polarized between the electrodes 15a and 15f and the electrodes 16a and 16f until the degree of polarization reaches saturation. The piezoelectric member is polarized between the electrodes 16a and 16f and the electrodes 17a and 17f until the degree of polarization reaches saturation. The piezoelectric member 11 is polarized between the electrodes 17a and 17f and the electrodes 18a and 18f until the degree of polarization reaches saturation. The piezoelectric member 11 is polarized between the electrodes 18*a* and 18*f* and the terminal electrode 21 until the degree of polarization reaches saturation.

As described above, a piezoelectric transformer according to the preferred embodiments of the present invention is obtained such that a piezoelectric member has two different portions with two different degrees of polarization and, more specifically, the degree of polarization near the boundary between the driving section and the power-generating section is lower than the polarization in areas spaced from the boundary between the driving section and the power-generating section. In one example, the piezoelectric transformer according to preferred embodiment described above measures approximately 40 mm by 20 mm by 2 mm.

For comparison, a conventional piezoelectric transformer was prepared which had the same dimensions and the same electrode configuration as the above-described piezoelectric transformer constructed according to a preferred embodiment of the present invention and which had a uniform degree of polarization in the driving section and a uniform degree of polarization in the power-generating section.

Mechanical strength was compared between the piezoelectric transformer according to the preferred embodiments of the present invention and the conventional piezoelectric transformer. Breakage-resistance strength of ten units for each piezoelectric transformer was measured in the thickness direction. The obtained data was plotted on Weibull probability paper to obtain mean breaking strength ($\mu$) and form factor (m). Table 1 shows the results.

TABLE 1

|  | Mean breaking strength [$\mu$] (kgf/mm$^2$) | Form factor [m] |
| --- | --- | --- |
| Inventive transformer | 13.6 | 14.9 |
| Conventional transformer | 6.7 | 4.7 |

As shown in Table 1, the piezoelectric transformer according to the preferred embodiments of the present invention has about double the mean breaking strength and a greatly reduced dispersion as indicated by the form factor as compared with the conventional piezoelectric transformer. This means that the piezoelectric transformer according to the preferred embodiments of the present invention does not experience defects such as micro-cracks formed during polarization.

A piezoelectric transformer according to the present invention is not limited to only those preferred embodiments described above and may be modified in various ways within the scope of the present invention. The positions, shapes, and number of driving electrodes, the positions, shapes, and number of electrodes used for polarization, and the position and shape of a power-generating terminal electrode can be changed as required.

The above preferred embodiments include a laminated piezoelectric transformer. A single-plate piezoelectric transformer may be used in which driving electrodes are formed on opposite surfaces of a piezoelectric member.

In the above preferred embodiments, the polarization electrodes are located on the piezoelectric transformer. The electrodes may be removed from the surfaces of the piezoelectric member after polarization according to a desired use.

In the above preferred embodiments, both the driving section and the power-generating section have areas with low degrees of polarization. Such an area may be provided for only one of the driving and the power-generating sections.

In the above preferred embodiments, in order to integrally form the piezoelectric transformer, a method is used in which laminated green sheets made up of a piezoelectric material are sintered. Other methods may be used such as superposition of piezoelectric-member paste in printing and fusion of sintered members.

In the above preferred embodiments, a ceramic material is used for the piezoelectric member. Other materials such as piezoelectric resin and a composite of ceramic and piezoelectric resin may be used.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A piezoelectric transformer comprising:
a piezoelectric member including a driving section located at a first half of the piezoelectric member and a power-generating section located at a second half of the piezoelectric member opposite to the first half of the piezoelectric member, the power-generating section including a plurality of polarization electrodes disposed on top and bottom surfaces of the piezoelectric member and spaced along a length of the piezoelectric member in the power-generating section, the power generating section including at least a first portion and a second portion, wherein the first portion has a first degree of polarization, the second portion has a second degree of polarization larger than said first degree of polarization and said first portion is located between a first and a second of the plurality of polarization electrodes and said second portion is located between the second and a third of the plurality of polarization electrodes.

2. A piezoelectric transformer according to claim 1, further comprising at least two polarization electrodes disposed within an inner portion of the piezoelectric member and spaced from each other along a width of the piezoelectric member.

3. A piezoelectric transformer according to claim 1, wherein at least one of the driving section and the power generating section has an area which is near a boundary between the driving section and the power-generating section and which has a lower degree of polarization than a degree of polarization of areas of the driving section and the power-generating section which are spaced from the boundary between the driving section and the power-generating section, the areas of the driving section and the power-generating section which are spaced from the boundary are polarized to a point of saturation.

4. A piezoelectric transformer according to claim 1, wherein the piezoelectric member comprises an integral unit including a plurality of separate piezoelectric layers.

5. A piezoelectric transformer according to claim 1, wherein the piezoelectric member comprises a single, unitary plate member.

6. A piezoelectric transformer according to claim 2, the driving section includes a portion of the piezoelectric member which is polarized in a thickness direction thereof.

7. A piezoelectric transformer according to claim 2, the power-generating section includes a portion of the piezoelectric member which is polarized in a longitudinal direction thereof.

8. A piezoelectric transformer according to claim 2, wherein the driving section includes first and second electrodes disposed on opposite sides of the piezoelectric member at a first end of the piezoelectric member and the power-generating section includes a third electrode disposed at a second end of the piezoelectric member opposite to the first end.

9. A piezoelectric transformer comprising:
a piezoelectric member including an integrally formed driving section and power-generating section, the driving section having at least one driving electrode and including a first half portion of the piezoelectric member which is polarized in a thickness direction of the piezoelectric member, the power-generating section including at least one power generating electrode and a second half portion of the piezoelectric member which is polarized in a longitudinal direction of the piezoelectric member, wherein at least one of the driving section and the power-generating section has an area which is located adjacent a boundary between the driving section and the power-generating section and which has a lower degree of polarization than a degree of polarization of areas of the driving section and the power generating section which are spaced from the boundary between the driving section and the power generating section, the power-generating section including a first portion and a second portion, wherein the first portion has a first degree of polarization, the second portion has a second degree of polarization larger than said first degree of polarization, and including a plurality of polarization electrodes disposed inside of the piezoelectric member at the boundary between the driving section and the power generating section and spaced from each other along a width direction of the piezoelectric member.

10. A piezoelectric transformer according to claim 9, wherein said piezoelectric member is made of a ceramic material.

11. A piezoelectric transformer according to claim 9, wherein the areas of the driving section and the power-generating section which are spaced from the boundary are polarized to a point of saturation.

12. A piezoelectric transformer according to claim 9, wherein the piezoelectric member comprises an integral unit including a plurality of separate piezoelectric layers.

13. A piezoelectric transformer according to claim 9, wherein the piezoelectric member comprises a single, unitary plate member.

* * * * *